(12) United States Patent
Min

(10) Patent No.: US 11,769,700 B2
(45) Date of Patent: Sep. 26, 2023

(54) SEMICONDUCTOR SUBSTRATE, SEMICONDUCTOR PACKAGE INCLUDING SEMICONDUCTOR SUBSTRATE, AND TEST METHOD OF SEMICONDUCTOR SUBSTRATE

(71) Applicant: SK hynix Inc., Icheon-si (KR)

(72) Inventor: Bok Gyu Min, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 136 days.

(21) Appl. No.: 16/997,377

(22) Filed: Aug. 19, 2020

(65) Prior Publication Data

US 2021/0280476 A1    Sep. 9, 2021

(30) Foreign Application Priority Data

Mar. 6, 2020  (KR) .................. 10-2020-0028051

(51) Int. Cl.
*H01L 21/66* (2006.01)
*H01L 23/00* (2006.01)
*H01L 23/498* (2006.01)

(52) U.S. Cl.
CPC .............. *H01L 22/32* (2013.01); *H01L 22/14* (2013.01); *H01L 23/49838* (2013.01); *H01L 24/06* (2013.01); *H01L 24/09* (2013.01); *H01L 24/16* (2013.01); *H01L 24/81* (2013.01); *H01L 2224/06181* (2013.01); *H01L 2224/06515* (2013.01); *H01L 2224/09181* (2013.01); *H01L 2224/16106* (2013.01); *H01L 2224/16145* (2013.01); *H01L 2224/16227* (2013.01); *H01L 2224/81801* (2013.01); *H01L 2224/81908* (2013.01)

(58) Field of Classification Search
None
See application file for complete search history.

(56) References Cited

U.S. PATENT DOCUMENTS

| 9,128,148 | B2 | 9/2015 | Lowney et al. |
| 9,679,507 | B2 * | 6/2017 | Shin .................. G09G 3/006 |
| 10,074,618 | B1 * | 9/2018 | Chen ................ H01L 23/49827 |
| 10,690,717 | B2 * | 6/2020 | Whetsel ................ H01L 22/32 |
| 2009/0309216 | A1 * | 12/2009 | Jeon .................... H01L 24/12 |
| | | | 257/737 |

(Continued)

FOREIGN PATENT DOCUMENTS

| KR | 100553562 B1 | 2/2006 |
| KR | 100764055 B1 * | 10/2007 .......... H01L 23/3114 |
| KR | 1020150086684 A | 7/2015 |

*Primary Examiner* — Telly D Green
(74) *Attorney, Agent, or Firm* — WILLIAM PARK & ASSOCIATES LTD.

(57) ABSTRACT

A semiconductor substrate including an upper surface and a lower surface may include a bump pad unit disposed on the upper surface. The semiconductor substrate may also include test pads disposed on the upper surface or the lower surface. The semiconductor substrate may also include traces configured to connect the bump pad unit and the test pads. The bump pad unit includes a main bump pad disposed on the upper surface, and a plurality of side bump pads disposed on the upper surface to be spaced apart from the main bump pad. The traces may connect the main bump pad and the plurality of side bump pads to the test pads in a one-to-one manner.

10 Claims, 15 Drawing Sheets

(56) References Cited

U.S. PATENT DOCUMENTS

| | | | |
|---|---|---|---|
| 2010/0295567 A1* | 11/2010 | Chang | G01R 31/70 |
| | | | 324/719 |
| 2014/0253171 A1 | 9/2014 | Lowney et al. | |
| 2015/0279258 A1* | 10/2015 | Shin | G09G 3/006 |
| | | | 324/755.01 |
| 2019/0067244 A1* | 2/2019 | Chen | H01L 24/08 |

* cited by examiner

SEMICONDUCTOR SUBSTRATE, SEMICONDUCTOR PACKAGE INCLUDING SEMICONDUCTOR SUBSTRATE, AND TEST METHOD OF SEMICONDUCTOR SUBSTRATE

CROSS-REFERENCE TO RELATED APPLICATIONS

The present application claims priority under 35 U.S.C. 119(a) to Korean Application No. 10-2020-0028051, filed on Mar. 6, 2020, which is incorporated herein by references in its entirety.

BACKGROUND

1. Technical Field

The present disclosure generally relates to a semiconductor substrate, a semiconductor package including a semiconductor substrate, and a test method of a semiconductor substrate.

2. Related Art

Generally, a semiconductor package is configured to include a semiconductor substrate including printed circuits and a semiconductor chip mounted on the semiconductor substrate. The semiconductor chip, formed by performing various semiconductor processes on a wafer, is electrically connected to the semiconductor substrate through a connecting means such as bumps or wires. For example, a flip chip package, which is a type of semiconductor package, includes a structure in which a semiconductor chip and a package substrate are opposed to each other, and the semiconductor chip and the package substrate are connected by conductive bumps and pads. In this case, if the semiconductor chip and the package substrate are not electrically connected because the bumps and the pads are not normally bonded, the semiconductor package might not operate normally. In order to identify such a connection failure, various non-destructive detection means, such as X-rays, have been used.

SUMMARY

According to an aspect of the present disclosure, a semiconductor substrate including an upper surface and a lower surface may include a bump pad unit disposed on the upper surface. The semiconductor substrate may also include test pads disposed on the upper surface or the lower surface. The semiconductor substrate may also include traces configured to connect the bump pad unit and the test pads. The bump pad unit may include a main bump pad disposed on the upper surface, and a plurality of side bump pads disposed on the upper surface to be spaced apart from the main bump pad. The traces may connect the main bump pad and the plurality of side bump pads to the test pads in a one-to-one manner.

A semiconductor package according to another aspect of the present disclosure may include a semiconductor substrate including an upper surface and a lower surface, a bump pad unit including a main bump pad disposed on the upper surface and a plurality of side bump pads disposed on the upper surface to be spaced apart from the main bump pad, bumps bonded to the bump pad unit, test pads disposed on the upper surface or the lower surface, and traces provided in the semiconductor substrate to connect the main bump pad and the plurality of side bump pads to the test pads in a one-to-one manner. The test pads may be electrically connected to the main bump pad and the plurality of side bump pads, respectively, such that whether the main bump pad and the plurality of side bump pads are electrically connected is detected by a test signal input from outside of the semiconductor substrate.

DETAILED DESCRIPTION

Figure 1:
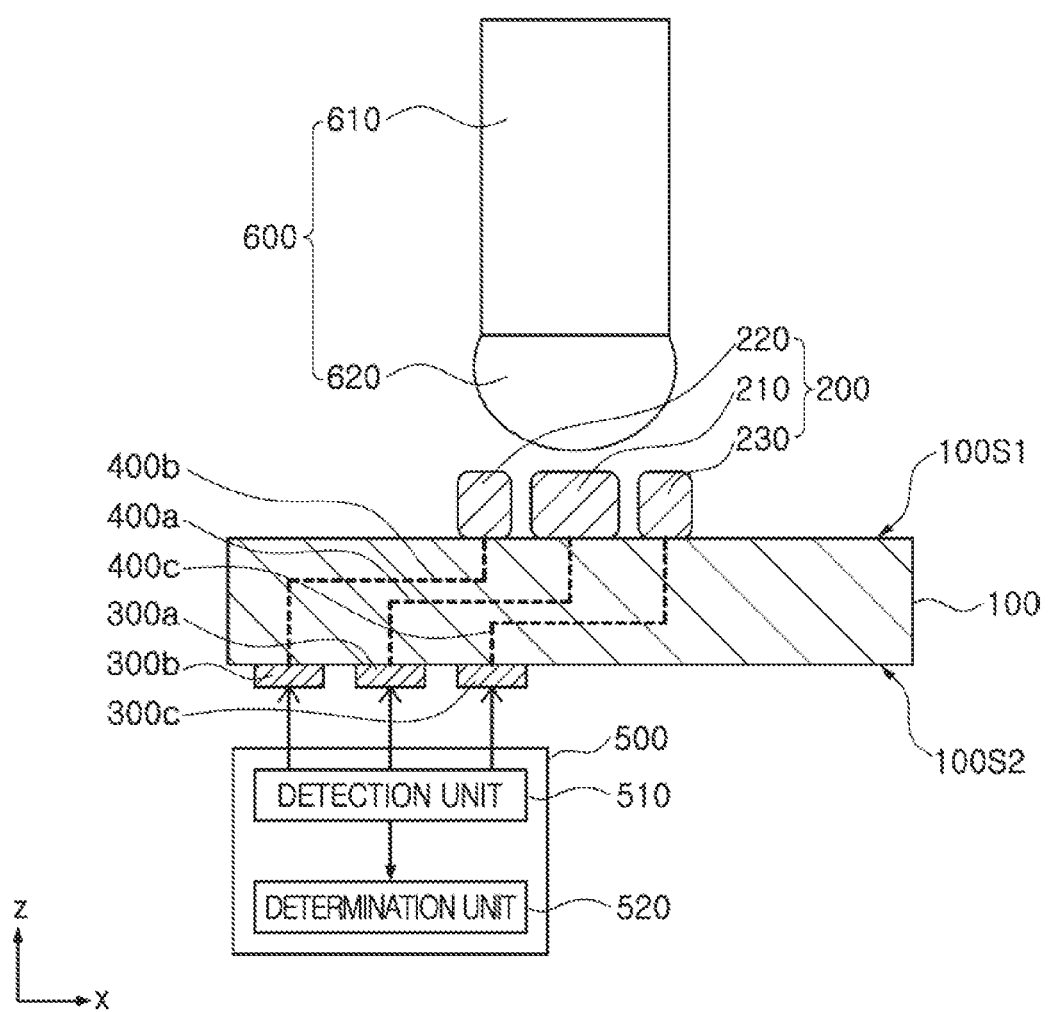
FIG. 1 is a view schematically illustrating an example of a configuration of a semiconductor substrate and a test device for testing the same according to an embodiment of the present disclosure.

The terms used herein may correspond to words selected in consideration of their functions in the present embodiments, and the meanings of the terms may be construed to be different according to those of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. It will be understood that although the terms "first" and "second," "top" and "bottom," "upper surface" and "lower surface," "left" and "right," etc. may be used herein to describe various elements, these elements should not be limited by these terms. These terms are only used to distinguish one element from another element, but not used to define only the element itself or to mean a particular sequence.

In this specification, when an element is referred to as being "connected" or "coupled" to another element, the element may be electrically and/or mechanically connected or coupled to the other element directly, or may form a connection relationship or coupling relationship by replacing the other element therebetween. Also, in this specification, when a part "includes (or has)" a certain component, this means that other components may be further "included" than excluding other components unless specifically stated otherwise. In addition, in describing the embodiment disclosed herein, when it is determined that a detailed description of related known technologies may obscure the gist of the embodiments disclosed herein, the detailed description is omitted.

Throughout the present specification, the same reference numerals may refer to the same components. Although the same reference numerals or similar reference numerals are not mentioned or described in a specific drawing, the reference numerals may be described based on other drawings. In addition, even if there are parts in the specific drawings in which reference signs are not indicated, the parts may be described based on other drawings. Further, the number, shape, size and relative differences of the components included in the drawings of the present application are configured for convenience of understanding, and do not limit the embodiments and may be implemented in various forms.

The semiconductor chip described in the present disclosure may include a shape in which a semiconductor substrate in which an electronic circuit is integrated is cut into a die shape. The semiconductor package may mean a memory chip in which a memory integrated circuit such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) is integrated. In addition, the semiconductor chip may mean a logic chip or an ASIC chip in which a logic circuit is integrated on a semiconductor substrate. The semiconductor chip may be referred to as a semiconductor die according to a cut shape.

FIG. 1 is a view schematically illustrating an example of a configuration of a semiconductor substrate 100 and a test device 500 for testing the same according to an embodiment of the present disclosure.

Referring to FIG. 1, the semiconductor substrate 100 may include an upper surface 100S1 and a lower surface 100S2. A bump pad unit 200 configured to be bonded to a conductive structure may be disposed on the upper surface 100S1. The conductive structure may be a bump 600 illustrated in FIG. 1. Test pads 300a, 300b, and 300c may be disposed on the upper surface 100S1 or the lower surface 100S2 to be spaced apart from each other. Traces 400a, 400b, and 400c may be provided in the substrate 100 to connect the pads 210, 220, and 230 included in the bump pad unit 200 to the test pads 300a, 300b, and 300c one-to-one. The test pads 300a, 300b, and 300c may be electrically connected to the pads 210, 220, and 230 included in the bump pad unit 200 such that whether a main bump pad 210 and a plurality of side bump pads 220 and 230 are electrically connected to each other is detected by a test signal applied from outside of the semiconductor substrate 100. According to the present embodiment, a semiconductor package including the semiconductor substrate 100, the bump pad unit 200, the bump 600, the test pads 300a, 300b, and 300c, and the traces 400a, 400b, and 400c can be provided in various forms.

Referring to FIG. 1, the bump pad unit 200 may include the main bump pad 210 disposed on the upper surface 100S1, and the plurality of side bump pads 220 and 230 disposed on the upper surface 100S1 to be spaced apart from the main bump pad 210. The plurality of side bump pads 220 and 230 may include a first side bump pad 220 and a second side bump pad 230. The first side bump pad 220 and the second side bump pad 230 may have the same shape and size. The main bump pad 210, the first side bump pad 220, and the second side bump pad 230 may be used to determine the bonding state of the bump pad unit 200 and a conductive structure bonded to the bump pad unit 200.

The first side bump pad 220 and the second side bump pad 230 may be arranged in a line with the main bump pad 210. The first side bump pad 220 may be disposed on the upper surface of the semiconductor substrate 100 spaced apart from the main bump pad 210 in a first side direction from the main bump pad 210. The second side bump pad 230 may be disposed on the upper surface of the semiconductor substrate 100 spaced apart from the main bump pad 210 in a second side direction from the main bump pad 210. The main bump pad 210 may be disposed at the center between the first side bump pad 220 and the second side bump pad 230. The first side bump pad 220 and the second side bump pad 230 may be disposed to be spaced apart from the main bump pad by the same distance in the first and second directions. The first and second directions are opposite directions. That is, the first side bump pad 220 and the second side bump pad 230 may be disposed on the upper surface 100S1 of the semiconductor substrate 100 so as to be symmetrical with respect to the main bump pad 210.

The shapes and sizes of the main bump pad 210, the first side bump pad 220, and the second side bump pad 230, and the spacings therebetween may be variously implemented. As an example, the main bump pad 210 may have larger shape and size than the first side bump pad 220 and the second side bump pad 230. In this regard, when the contact area of the main bump pad 210 for bonding with a conductive structure is formed to be larger than other pads, the bonding force between the bump pad unit 200 and the conductive structure may be increased.

Referring to FIG. 1, the test pads 300a, 300b, and 300c may be disposed on the lower surface 100S2 of the semiconductor substrate 100. When the semiconductor substrate 100 is provided in a form of a semiconductor package, the test pads 300a, 300b, and 300c may be disposed in a specific area of the semiconductor substrate 100. As an example, the specific area may correspond to an outer area of the semiconductor substrate 100. The test pads 300a, 300b, and 300c may be electrically connected to the main bump pad 210, the first side bump pad 220, and the second side bump pad 230 by the traces 400a, 400b, and 400c, respectively. The first test pad 300a may be electrically connected to the main bump pad 210, the second test pad 300b may be electrically connected to the first bump pad 220, and the third test pad 300c may be electrically connected to the second bump pad 230. In some embodiments not illustrated, the test pads 300a, 300b, and 300c may be disposed on the upper surface 100S1 or the lower surface 100S2 of the semiconductor substrate 100. In addition, the positions in which the test pads 300a, 300b, and 300c are disposed may be implemented in various modifications within the region of the semiconductor substrate 100.

Referring to FIG. 1, the traces 400a, 400b, and 400c may connect the test pads 300a, 300b, and 300c to the main bump pad 210, the first side bump pad 220, and the second side bump pad 230, respectively. That is, the traces 400a, 400b, and 400c may be disposed in the semiconductor substrate 100 to electrically connect the corresponding bump pads to test pads, respectively. The first trace 400a may be disposed in the semiconductor substrate 100 to electrically connect the main bump pad 210 to the first test pad 300a. The second trace 400b may be disposed in the semiconductor substrate 100 to electrically connect the first side bump pad 220 to the second test pad 300b. The third trace 400c may be disposed in the semiconductor substrate 100 to electrically connect the second side bump pad 230 to the third test pad 300c. The arrangement form of the traces 400a, 400b, and 400c may also be implemented in various modifications within the region of the semiconductor substrate 100.

Referring to FIG. 1, the bump 600 may be provided as a conductive structure bonded to the bump pad unit 200. The bump 600 may be disposed over the bump pad unit 200 to be bonded to the bump pad unit 200. Accordingly, the bump pad unit 200 and the bump 600 may be electrically connected to each other. The bump 600 may be bonded to at least one of the pads included in the bump pad unit 200. The bump 600 may include a body 610 serving as a support and a joint 620 connected to the body 610. The joint 620 may include, for example, a solder material for bonding. The body 610 may have a cylindrical shape and the joint 620 may have a hemispherical shape, but are not limited thereto. The joint 620 may be bonded to the main bump pad 210, and may be further bonded to the first side bump pad and the second side bump pad 230. In this case, it may be determined whether the bonding state of the bump pad unit 200 and the bump 600 is normal or abnormal according to the bonding type of the joint 620 and the pads.

Referring to FIG. 1, a test device 500 for testing the semiconductor substrate 100 may be provided. In another embodiment of the present disclosure, a test system including the above-described semiconductor substrate 100 and the test device 500 to be described below may be provided. The test device 500 may detect whether electrical connections between the main bump pad 210 and each of the plurality of side bump pads 220 and 230 through the test pads 300a, 300b, and 300c, respectively, and may determine whether a failure occurs. The test device 100 may include a detection unit 510 and a determination unit 520.

Referring to FIG. 1, the detection unit 510 may detect an energization state between the main bump pad 210 and the first side bump pad 220 and an energization state between the main bump pad 210 and the second side bump pad 230 through the test pads 300a, 300b, and 300c. The detection unit 510 may detect whether the energization state is an open state or a short-circuited state through a method of applying a test signal to the test pads 300a, 300b, and 300c when a conductive structure is bonded to the bump pad unit 200 in various forms. The detection unit 510 may apply a test signal to the first test pad 300a and the second test pad 300b to identify whether the main bump pad 210 electrically connected to the first test pad 300a and the first side bump pad 220 electrically connected to the second test pad 300b are electrically sort-circuited or open, respectively. Similarly, the detection unit 510 may apply a test signal to the first test pad 300a and the third test pad 300c to identify whether the main bump pad 210 electrically connected to the first test pad 300a and the second side bump pad 230 electrically connected to the third test pad 300c are electrically sort-circuited or open, respectively. As an example, the detection unit 510 may be implemented as a test pin such as a probe.

Referring to FIG. 1, the determination unit 520 may determine whether a failure has occurred on the basis of the detection result of the detection unit 510. As an example of determining whether a failure has occurred, whether the bonding state of the bump pad unit 200 and the bump 600 bonded to the bump pad unit 200 is normal may be determined. As another example, whether the arrangement state of a semiconductor chip mounted on the semiconductor substrate 100 through the pads and bump 600 may be determined. The determination unit 520 may be implemented in the form of a test circuit using test pins.

As a detection result of the detection unit 510, when the energization state of the main bump pad 210 and the first side bump pad 220 and the energization state of the main bump pad 210 and the second side bump pad 230 are both short-circuited states, the determination unit 520 may determine that no failure has occurred. Alternatively, as the detection result of the detection unit 510, at least one of the energization state of the main bump pad 210 and the first side bump pad 220 and the energization state of the main bump pad 210 and the second side bump pad 230 is open state, the determination unit 520 may determine that a failure has occurred.

Figure 2:
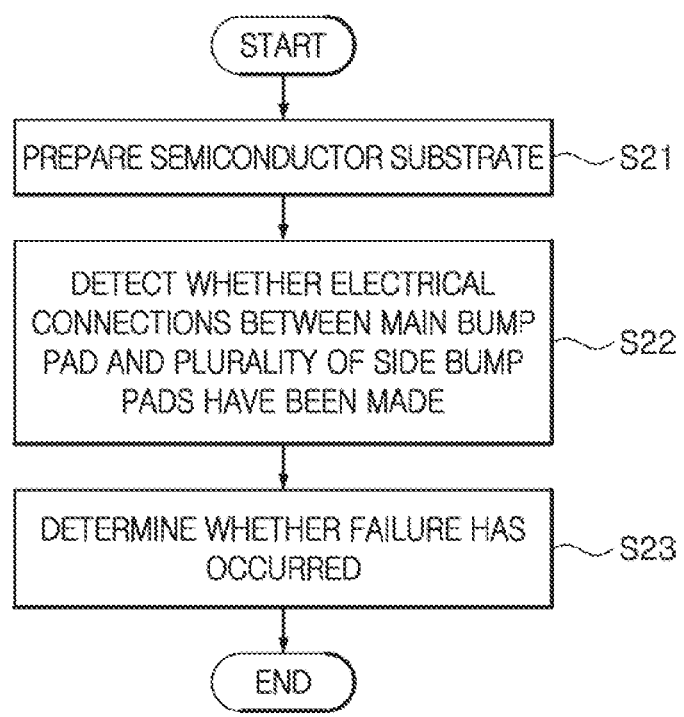
FIG. 2 is a flowchart illustrating a testing method of the semiconductor substrate illustrated in FIG. 1.

FIG. 2 is a flowchart illustrating a method of testing the semiconductor substrate 100 illustrated in FIG. 1.

Referring to FIGS. 1 and 2, the method of testing the semiconductor substrate 100 may include preparing the semiconductor substrate 100 (S21), detecting whether the main bump pad 210 and the plurality of side bump pads 220 and 230 disposed on the semiconductor substrate 100 are electrically connected (S22), and determining whether a failure has occurred (S23). In preparing the semiconductor substrate 100 (S21), as described above with reference to FIG. 1, the semiconductor substrate 100 may be provided with a bump pad unit 200 configured to be bonded to a conductive structure on the upper surface 100S1, test pads 300a, 300b, and 300c spaced apart from each other on the upper surface 100S1 or the lower surface 100S2, and traces 400a, 400b, and 400c disposed in the semiconductor substrate 100 to connect the pads included in the bump pad unit 200 and the test pads 300a, 300b, and 300c one-to-one.

In detecting the electrical connection (S22), as described above with reference to FIG. 1, the energization state of the main bump pad 210 and the first side bump pad 220 and the energization state of the main bump pad 210 and the second side bump pad 230 may be detected using the test device 500. The detecting whether the main bump pad 210 and the plurality of side bump pads 220 and 230 are electrically connected (S22) may be performed by the detection unit 510 illustrated in FIG. 1.

In determining whether a failure has occurred (S23), as described above with reference to FIG. 1, whether a failure has occurred may be determined using the test device 500 on the basis of the energization state of the main bump pad 210 and the first side bump pad 220 and the energization state of the main bump pad 210 and the second side bump pad 230. The determination of whether a failure has occurred (S23) may be performed by the determination unit 520 illustrated in FIG. 1.

In determining whether a failure has occurred (S23), when each of the energization states between the main bump pad 210 and the plurality of side bump pads 220 and 230 is a short-circuited state, it may be determined that a failure has not occurred. That is, as a result of detecting the electrical connection (S22), when the energization state of the main bump pad 210 and the first side bump pad 220 and the energization state of the main bump pad 210 and the second side bump pad 230 are both short-circuited states, it may be determined that a failure in a bonding position between the conductive structure and the bump pad unit 200 has not occurred.

On the other hand, in determining whether the failure has occurred (S23), when at least one of the energization states between the main bump pad 210 and the plurality of side bump pads 220 and 230 is an open state, it may be determined that a failure has occurred. That is, as a result of detecting the electrical connection (S22), when one of the energization state of the main bump pad 210 and the first side bump pad 220 and the energization state of the main bump pad 210 and the second side bump pad 230 is an open state, it may be determined that a failure in a bonding position between the conductive structure and the bump pad unit 200 has occurred.

In addition, in determining whether the failure has occurred (S23), when all of the energization states between the main bump pad 210 and the plurality of side bump pads 220 and 230 are open states, it may be determined that a wetting failure has occurred. That is, as a result of detecting the electrical connection (S22), when both the energization state of the main bump pad 210 and the first side bump pad 220 and the energization state of the main bump pad 210 and the second side bump pad 230 are open state, it may be determined that a connection failure between the conductive structure and the bump pad unit 200 has occurred.

Although not illustrated in FIG. 1, as described below with reference to FIG. 6, a semiconductor chip may be disposed on the conductive structure. Here, in determining whether a failure has occurred (S23), when each of the energization states between the main bump pad 210 and the plurality of side bump pads 220 and 230 is a short-circuited state, it may be determined that the misalignment of the semiconductor substrate 100 and the semiconductor chip has not occurred. On the other hand, in determining whether a failure has occurred (S23), when at least one of the energization states between the main bump pad 210 and the plurality of side bump pads 220 and 230 is an open state, it may be determined that the misalignment of the semiconductor substrate 100 and the semiconductor chip has occurred.

Figure 3:
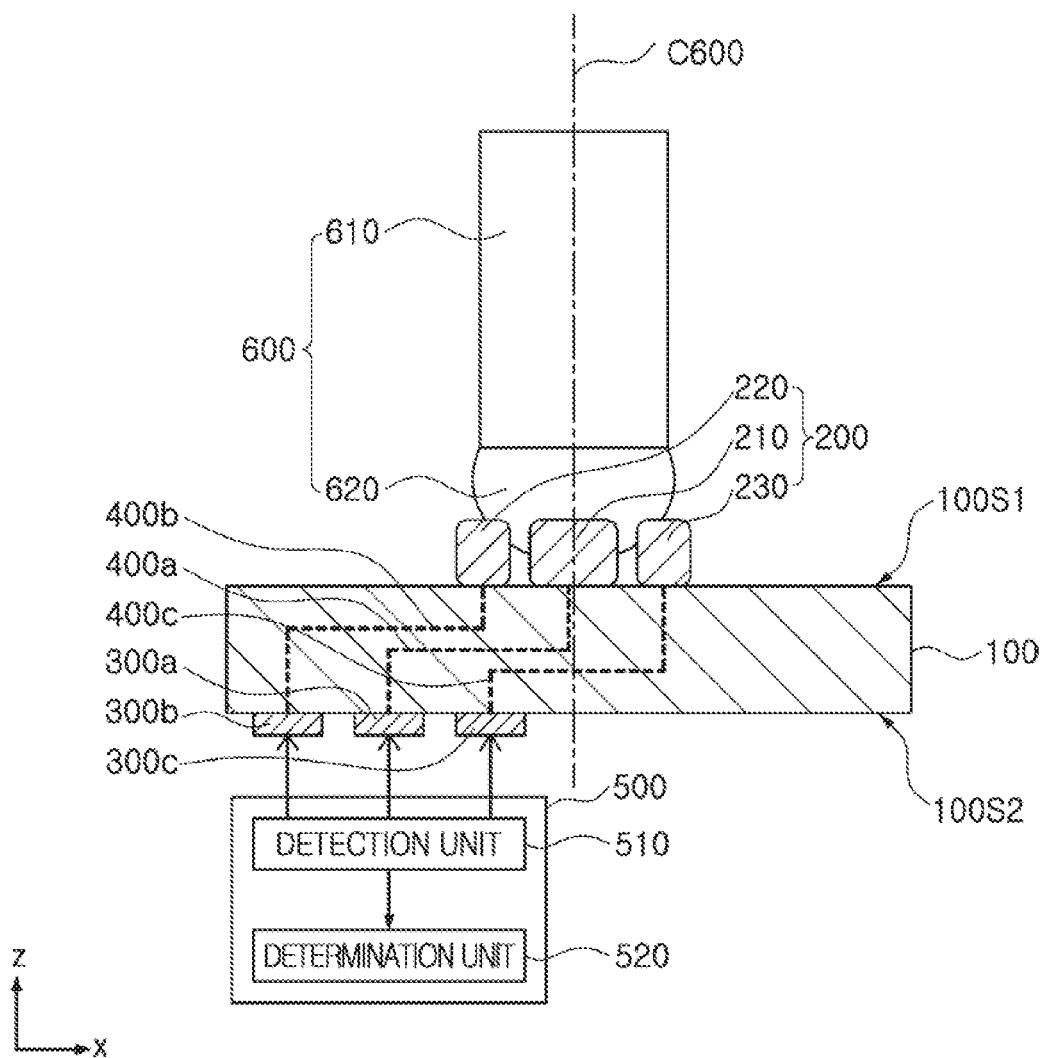
FIGS. 3 to 5 are views for explaining an example of a test method in more detail using the semiconductor substrate and the test device illustrated in FIG. 1.
Figure 4:
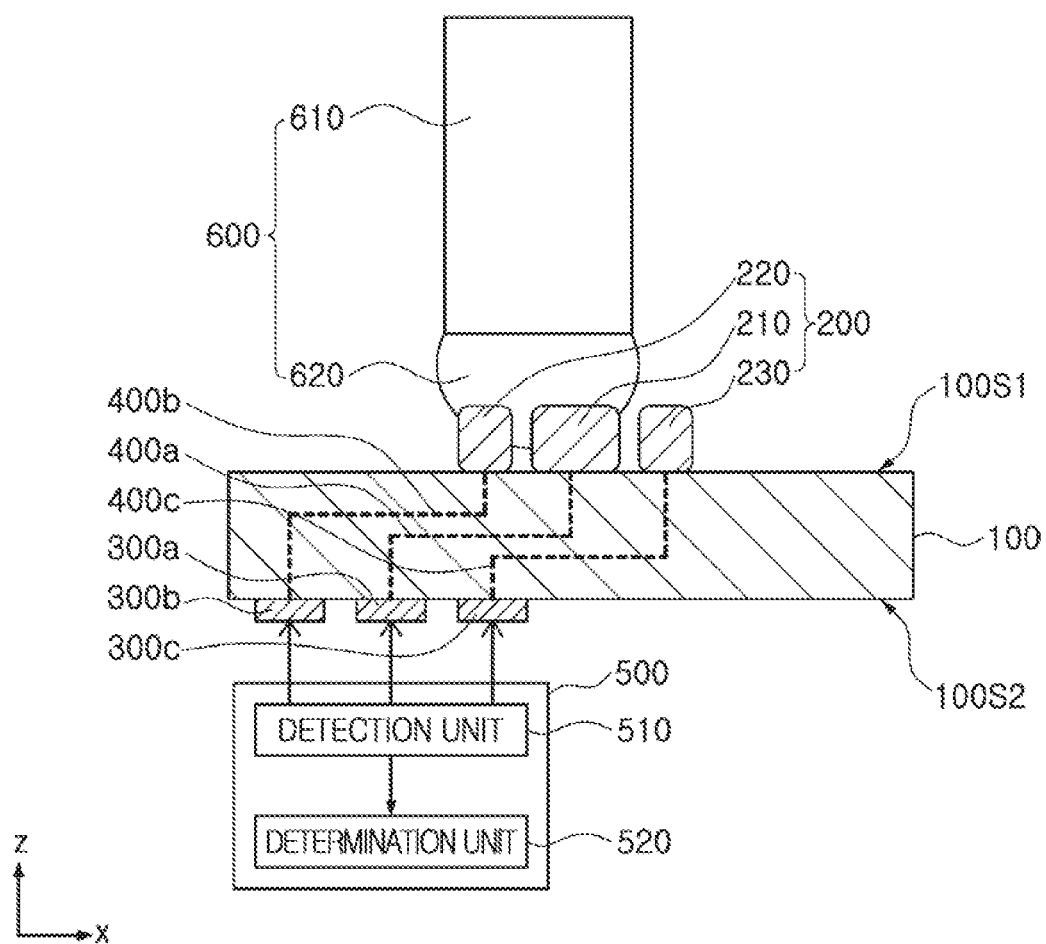
Figure 5:
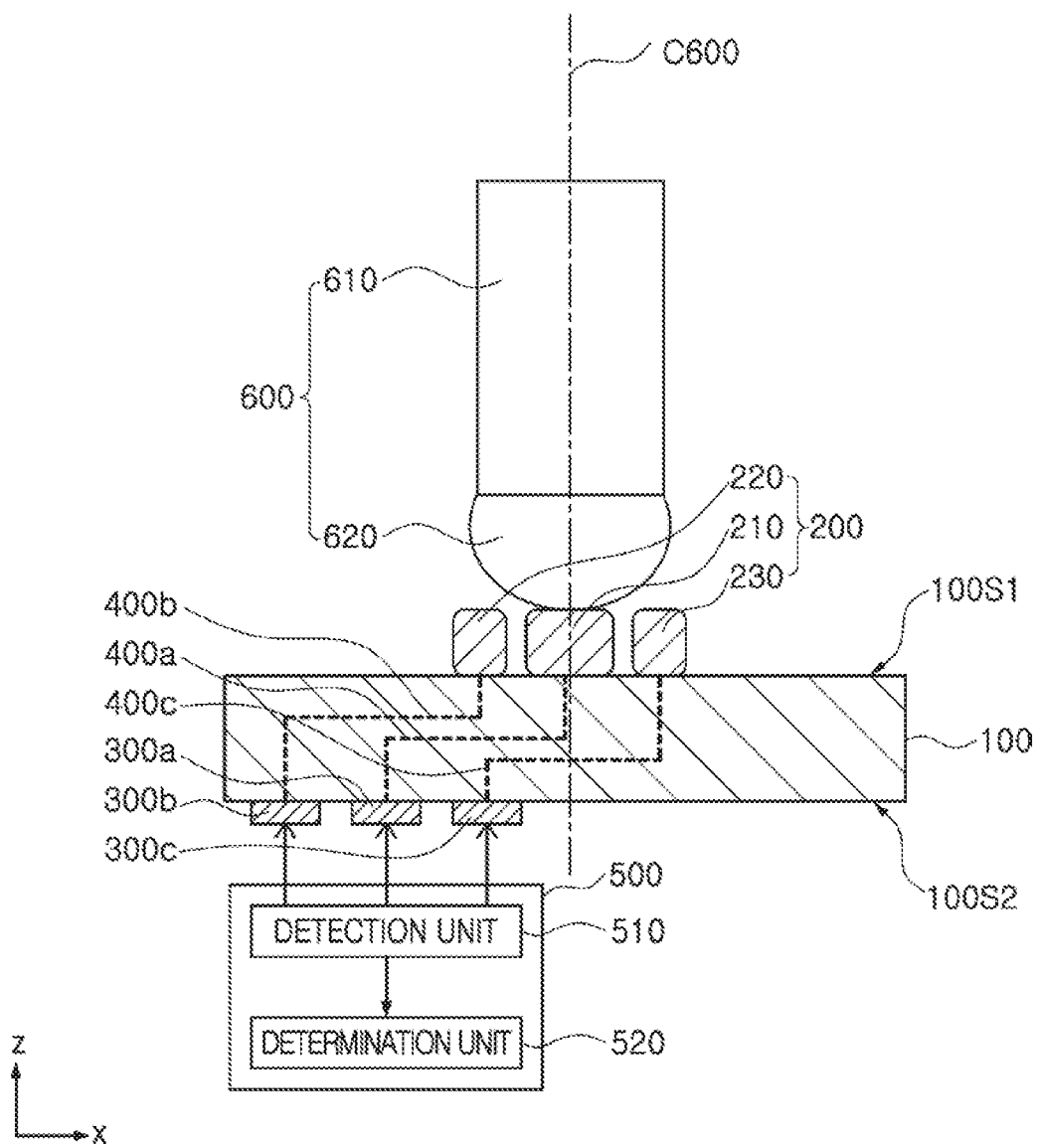

FIGS. 3 to 5 are views for explaining an example of a test method in more detail using the semiconductor substrate 100 and the test device 500 illustrated in FIG. 1. Hereinafter, a case for which a bump 600 is bonded to a bump pad unit 200 of the semiconductor substrate 100 illustrated in FIG. 1 will be described as an example.

FIG. 3 illustrates a case for which the bonding state between the bump pad unit 200 and the bump 600 is normal. Referring to FIG. 3, the central axis C600 of the bump 600 may be configured to be parallel to the z-axis and pass through the center of the bump 600. The central axis C600 may be configured to cross the center of the width of a body 610 disposed along the x-axis and the center of the width of a joint 620 disposed along the x-axis.

Referring to FIG. 3, the joint 620 may be bonded to all of the main bump pad 210, the first side bump pad 220, and the second side bump pad 230 to be electrically connected to each other. As an example, the bump pad unit 200 and the bump 600 may be joined such that the central axis C600 passes through the center of the main bump pad 210. In this case, a detection unit 510 may detect the energization state of the main bump pad 210 and the first side bump pad 220 and the energization state of the main bump pad 210 and the second side bump pad 230 through test pads 300a, 300b, and 300c. The main bump pad 210, the first side bump pad 220, and the second side bump pad 230 are all electrically connected by the joint 620, so that the detection results of the detection unit 510 may all be short-circuited states. Because the detection results by the detection unit 510 are all short-circuited states, the determination unit 520 may determine that no failure has occurred. Further, in this case, because the bonding failure between the bump pad unit 200 and the bump 600 has not occurred, the determination unit 520 may determine that the bonding state of the bump pad unit 200 and the bump 600 is normal, FIG. 4 illustrates an example in which the bonding state of the bump pad unit 200 and the bump 600 is abnormal. Referring to FIG. 4, the joint 620 may be bonded only to the main bump pad 210 and the first side bump pad 220, and might not be bonded to the second side bump pad 230. As a result, only the main bump pad 210 and the first side bump pad 220 are electrically connected to each other by the joint 620. Accordingly, the detection result by the detection unit 510 may be that the energization state of the main bump pad 210 and the first side bump pad 220 is a short-circuited state, and the energization state of the main bump pad 210 and the second side bump pad 230 is an open state. Because at least one of the detection results by the detection unit 510 is an open state, the determination unit 520 may determine that a failure has occurred. Further, in this case, because the bonding failure of the bump pad unit 200 and the bump 600 has occurred, the determination unit 520 may determine that the bonding state of the bump pad unit 200 and the bump 600 is abnormal. In addition, based on the detection results described above, the determination unit 520 may identify that the joint 620 has been shifted and bonded in the direction opposite to the second side bump pad 230 with respect to the main bump pad 210, that is, in the direction of the first side bump pad 220.

Although not illustrated, when the bonding state of the bump pad unit 200 and the bump 600 is abnormal, the joint 620 may be bonded only to the main bump pad 210 and the second side bump pad 230 and might not be bonded to the first side bump pad 220. As a result, only the main bump pad 210 and the second side bump pad 230 may be electrically connected to each other by the joint 620. Accordingly, as the detection result of the detection unit 510, the energization state of the main bump pad 210 and the first side bump pad 220 is an open state, and the energization of the main bump pad 210 and the second side bump pad 230 is a short-circuited state. As in the case of FIG. 4, because at least one of the detection results of the detection unit 510 is an open state, the determination unit 520 may determine that a failure has occurred. In this case, the determination unit 520 may determine that the bonding state of the bump pad unit 200 and the bump 600 is abnormal.

FIG. 5 illustrates another example in which the bonding state of the bump pad unit 200 and the bump 600 is abnormal. Referring to FIG. 5, the joint 620 may be bonded only to the main bump pad 210 and might not be bonded to the first side bump pad 220 and the second side bump pad 230. As a result, the joint 620 may be electrically connected only to the main bump pad 210. As the determination result of the detection unit 510, the energization state of the main bump pad 210 and the first side bump pad 220 is an open state, and the energization of the main bump pad 210 and the second side bump pad 230 is a short-circuited state. Because at least one of the detection results of the detection unit 510 is an open state, the determination unit 520 may determine that a failure has occurred.

Further, when all of the detection results of the detection unit 510 are open states as described above, it may be a case for which a wetting failure has occurred. At this time, the determination unit 520 may determine that a wetting failure has occurred. Referring to FIG. 5, the bump pad unit 200 and the bump 600 can be bonded so that the center axis C600 passes through the center of the main bump pad 210 even when a wetting failure occurs, so that the bonding state of the bump pad unit 200 and the bump 600 may appear normal. However, in this case, because only a small amount of solder material provided to the joint 620 contacts the main bump pad 210, the bump pad unit 200 and the bump 600 form a contact point, but the bump pad unit 200 and the bump 600 cannot form a physically stable bonding. As such, according to the present embodiment, it is possible to detect not only a failure in a bonding position according to the bonding type between pads and bumps, but also a wetting failure, which is a type of a connection failure.

FIGS. 6 to 9 are views for explaining in more detail another example of a test method using the semiconductor substrate 100 and the test device 500 illustrated in FIG. 1.

Hereinafter, a case for which a semiconductor chip 700 is bonded on the semiconductor substrate 100 through the bump pad unit 200 and the bump 600 illustrated in FIG. 1 will be described as an example.

Figure 6:
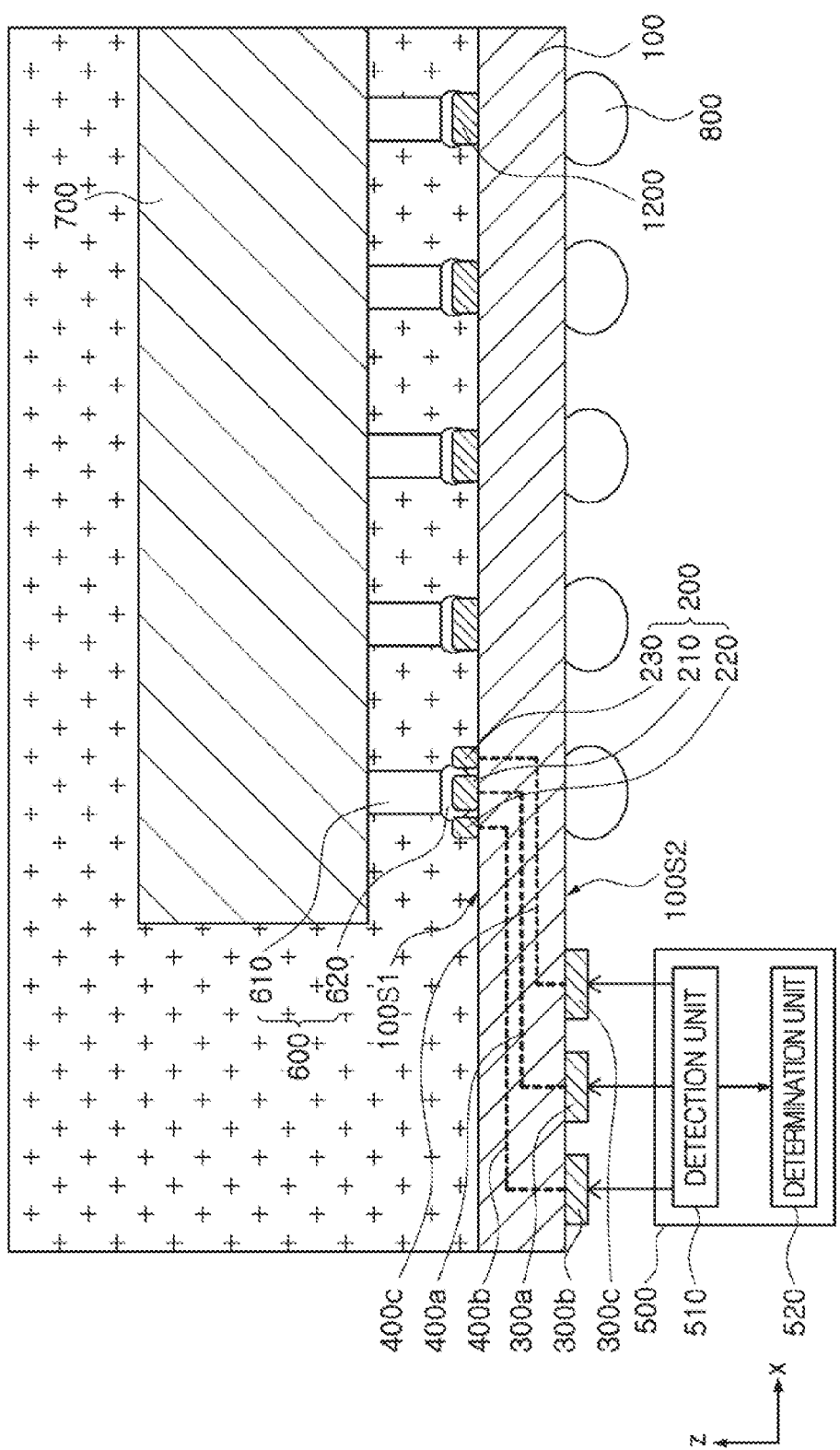
FIGS. 6 to 9 are views for explaining another example of a test method in more detail using the semiconductor substrate and the test device illustrated in FIG. 1.
Figure 7:
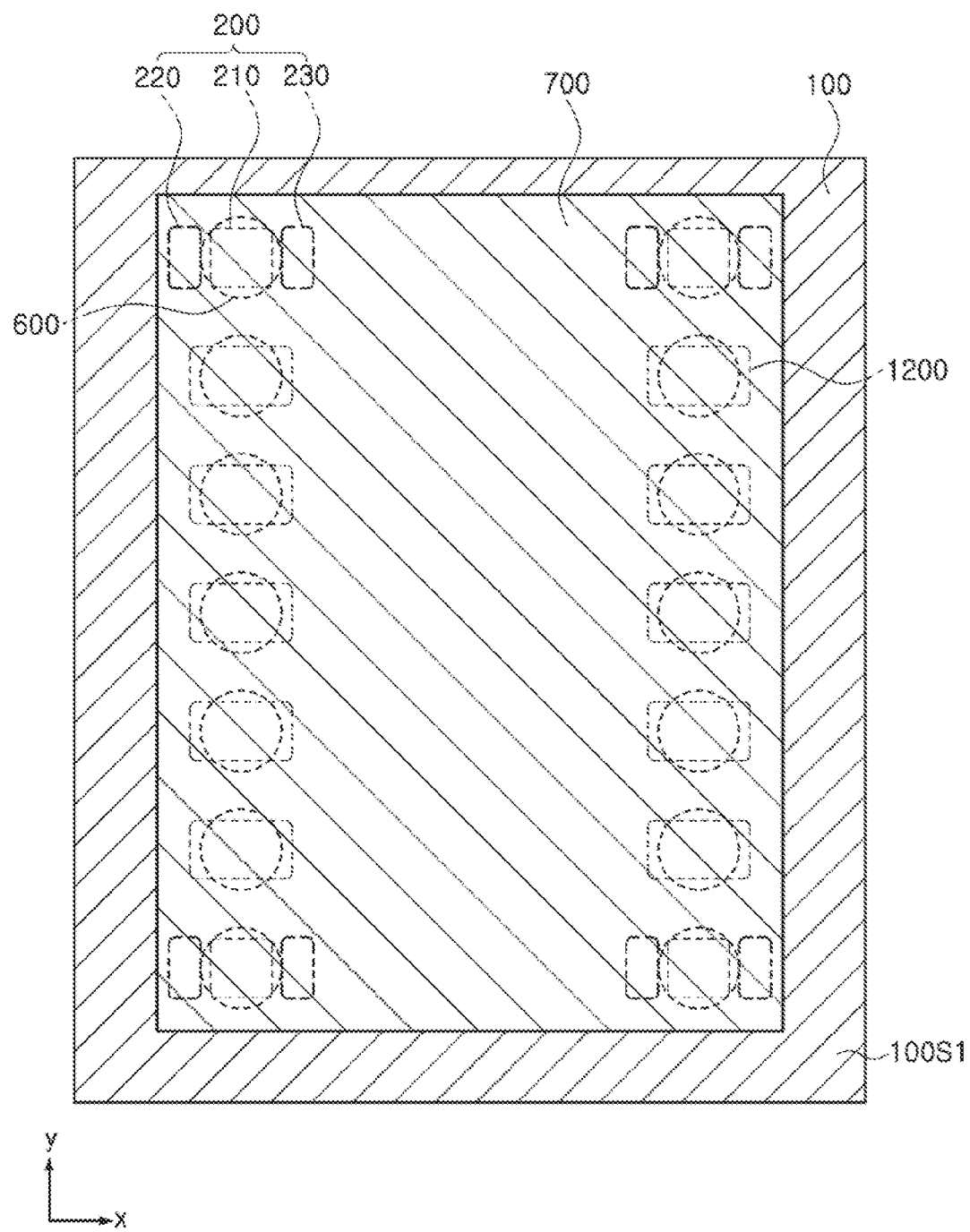

FIG. 6 illustrates a state in which the semiconductor substrate 100 and the semiconductor chip 700 are normally aligned, and FIG. 7 is a plan view of the semiconductor substrate 100 when the alignment state of the semiconductor substrate 100 and the semiconductor chip 700 is normal.

Referring to FIGS. 6 and 7, the semiconductor chip 700 may be mounted on the semiconductor substrate 100. The bumps 600 that are bonded to the bump pad unit 200 disposed on the semiconductor substrate 100 may be disposed on a surface of the semiconductor chip 700. In addition, bonding pads 1200 composed of a single pad may be further disposed on the semiconductor substrate 100. In order to connect the semiconductor chip 700 to the semiconductor substrate 100, the bumps 600 may be bonded to the bonding pads 1200 as well as the bump pad unit 200. Solder balls 800 for connecting the semiconductor substrate 100 to other semiconductor devices or the like may be disposed on the lower surface 100S2 of the semiconductor substrate 100. According to the present embodiment, a semiconductor package including the semiconductor substrate 100, the bump pad unit 200, the bumps 600, the test pads 300a, 300b, and 300c, the traces 400a and 400b, the bonding pads 1200, and the semiconductor chip 700 may be provided in various forms.

Referring to FIGS. 6 and 7, the joint 620 of each of the bumps 600 may be bonded and electrically connected to all of the main bump pad 210, the first side bump pad 220, and the second side bump pad 230. Here, a detection unit 510 may detect the energization state of the main bump pad 210 and the first side bump pad 220 and the energization state of the main bump pad 210 and the second side bump pad 230. In this case, all detection results of the detection unit 510 may become short-circuited states. Because the detection results of the detection unit 510 are all short-circuited states, a determination unit 520 may determine that no failure has occurred. Further, because the misalignment of the semiconductor substrate 100 and the semiconductor chip 700 has not occurred in this case, the determination unit 520 may determine that the alignment state of the semiconductor substrate 100 and the semiconductor chip 700 is normal.

Referring to FIGS. 6 and 7, a plurality of bump pad units 200 may be disposed on the upper surface 100S1 of the semiconductor substrate 100. In addition, a plurality of bumps 600 may be disposed and bonded on the plurality of bump pad units 200 to correspond to each other to mount the semiconductor chip 700 on the semiconductor substrate 100. As an example, four bump pad units 200 respectively including the main bump pad 210, the first side bump pad 220, and the second side bump pad 230 may be disposed in four corner regions of the upper surface 100S1, respectively, and the bonding pads 1200 respectively composed of a single pad may be arranged on the upper surface 100S1 in two rows. In addition, the bumps 600 may be disposed and bonded on the four bump pad units 200 and the four bonding pads 1200, and the semiconductor chip 700 may be disposed on the bumps 600. When the alignment state of the semiconductor substrate 100 and the semiconductor chip 700 is normal, the joint 620 of each of the bumps 600 may be electrically connected to all of the main bump pad 210, the first side bump pad 220, and the second side bump pad 230. At this time, each of the bumps 600 and each of the bump pad units 200 may be joined such that the center of the bump 600 coincides with the center of the bump pad unit 200.

Figure 8:
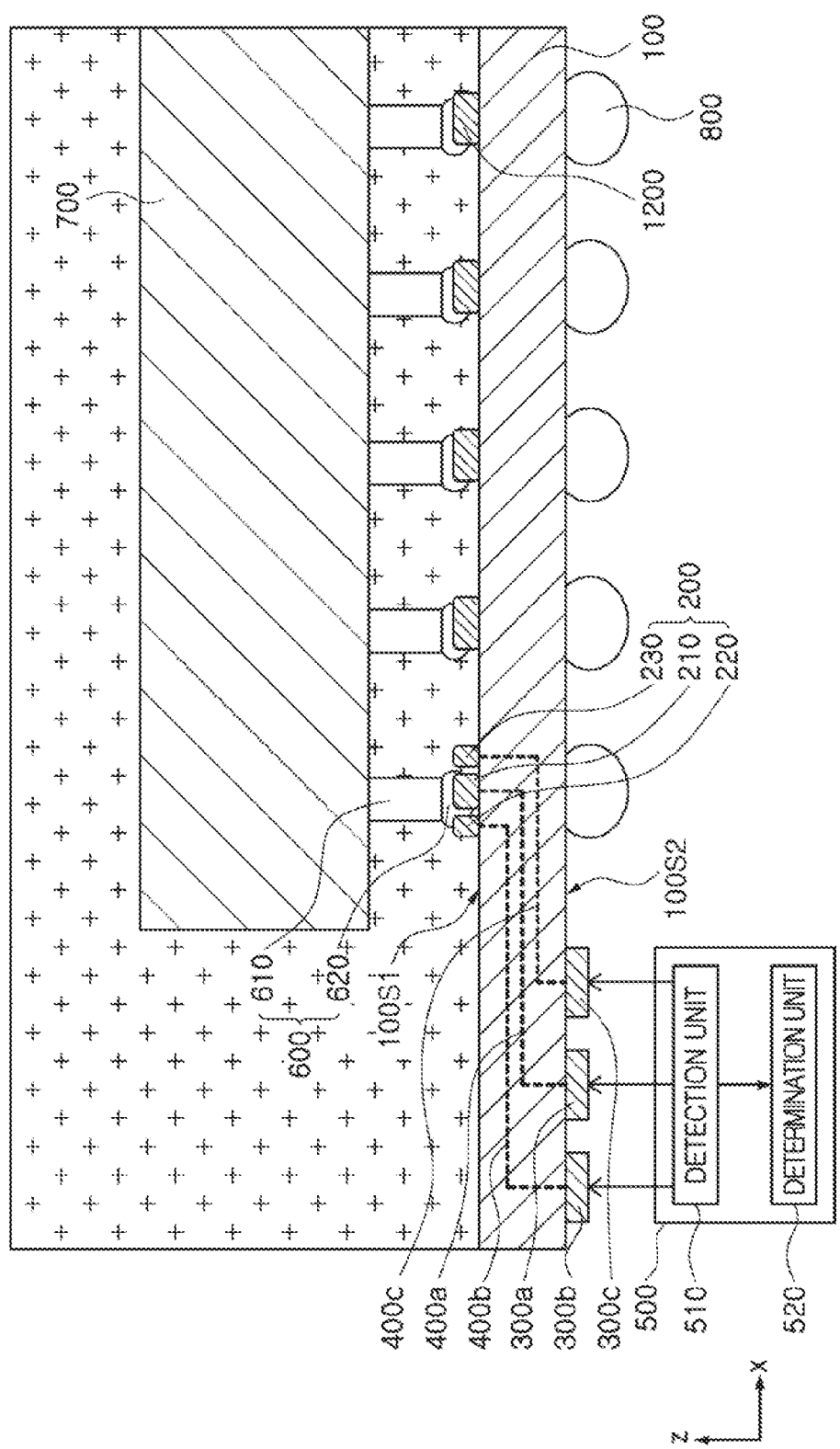
Figure 9:
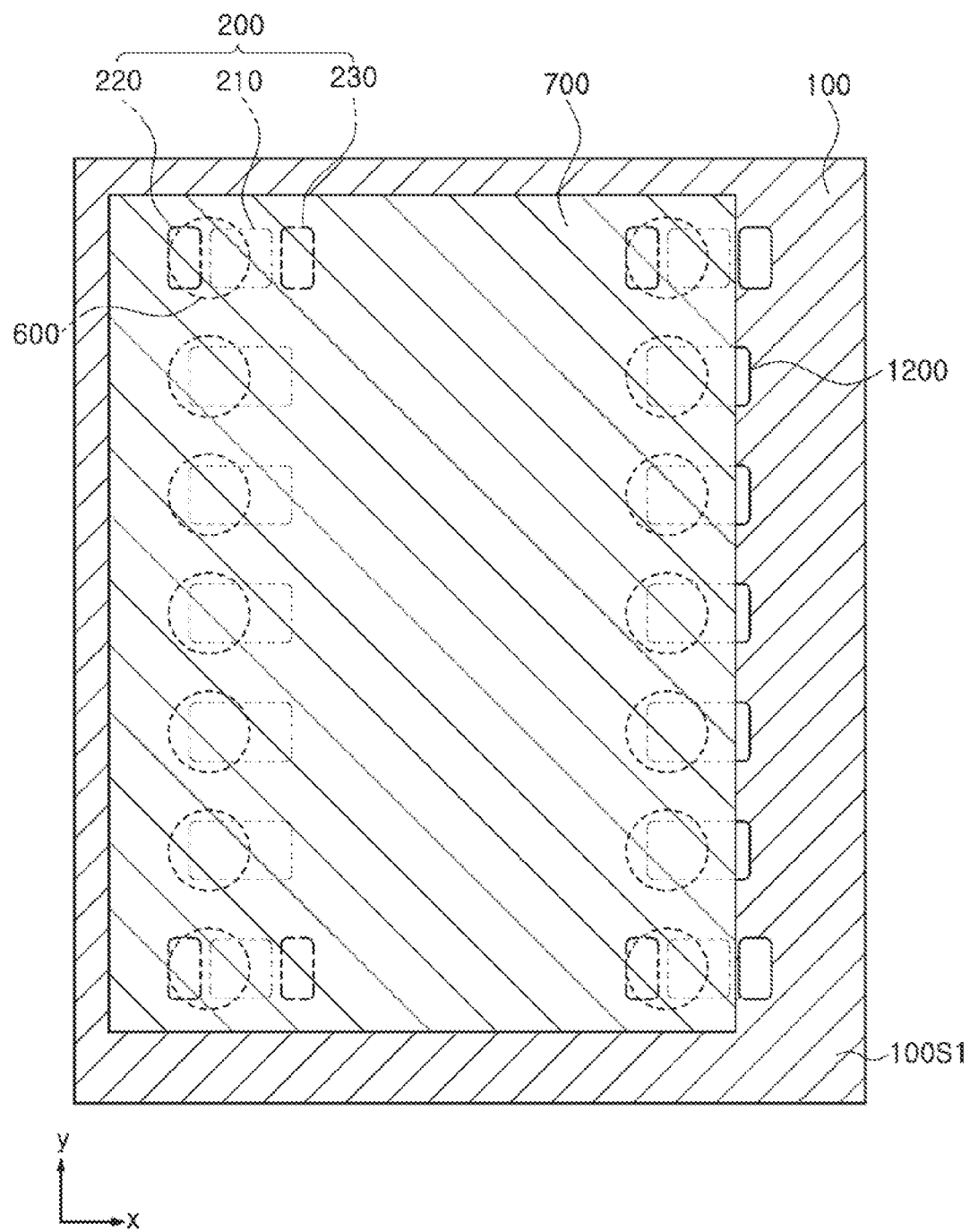

FIG. 8 illustrates a state in which the semiconductor substrate 100 and the semiconductor chip 700 are abnormally aligned, and FIG. 9 is a plan view of a semiconductor substrate 100 when the alignment state of the semiconductor substrate 100 and the semiconductor chip 700 is abnormal.

Referring to FIGS. 8 and 9, the joint 620 may be bonded only to the main bump pad 210 and the first side bump pad 220, and might not be bonded to the second side bump pad 230. In this case, as a detection result of the detection unit 510, the energization state of the main bump pad 210 and the first side bump pad 220 is a short-circuited state, and the energization state of the main bump pad 210 and the second side bump pad 230 is an open state. The determination unit 520 may determine that a failure has occurred because at least one of the detection results of the detection unit 510 is open state. Further, in this case, the determination unit 520 may determine that the alignment state of the semiconductor substrate 100 and the semiconductor chip 700 is abnormal because the misalignment of the semiconductor substrate 100 and the semiconductor chip 700 occurs. In addition, the determination unit 520 may determine that the bonding between the semiconductor substrate 100 and the semiconductor chip 700 has been shifted in the opposite direction of the second side bump pad 230, that is, in the direction of the first side bump pad 220.

Referring to FIGS. 8 and 9, as an example in which the alignment state of the semiconductor substrate 100 and the semiconductor chip 700 is abnormal, the bump 600 may be electrically connected only to the main bump pad 210 and the first side bump pad 220, and might not be electrically connected to the second side bump pad 230. Accordingly, the semiconductor chip 700 may be misaligned and disposed on the semiconductor substrate 100 while the semiconductor chip 700 is shifted to the left along the x-axis.

Although not illustrated, when the semiconductor substrate 100 and the semiconductor chip 700 are abnormally aligned, the joint 620 may be bonded only to the main bump pad 210 and the second side bump pad 230, and might not be bonded to the first side bump pad 220. In this case, as the detection result of the detection unit 510, the energization state of the main bump pad 210 and the first side bump pad 220 is an open state, and the energization state of the main bump pad 210 and the second side bump pad 230 is a short-circuited state. The determination unit 520 may determine that a failure has occurred because at least one of the detection results of the detection unit 510 is open state. Further, in this case, because the misalignment of the semiconductor substrate 100 and the semiconductor chip 700 has occurred, the determination unit 520 may determine that the alignment state of the semiconductor substrate 100 and the semiconductor chip 700 is abnormal. In addition, the determination unit 520 may determine that the bonding position of the semiconductor substrate 100 and the semiconductor chip 700 has been shifted in the opposite direction with respect to the second side bump pad 230, that is, in the direction of the first side bump pad 220, based on the detection result. In this case, the semiconductor chip 700 may be misaligned and disposed on the semiconductor substrate 100 while the semiconductor chip 700 is shifted to the right along the x-axis.

Figure 10:
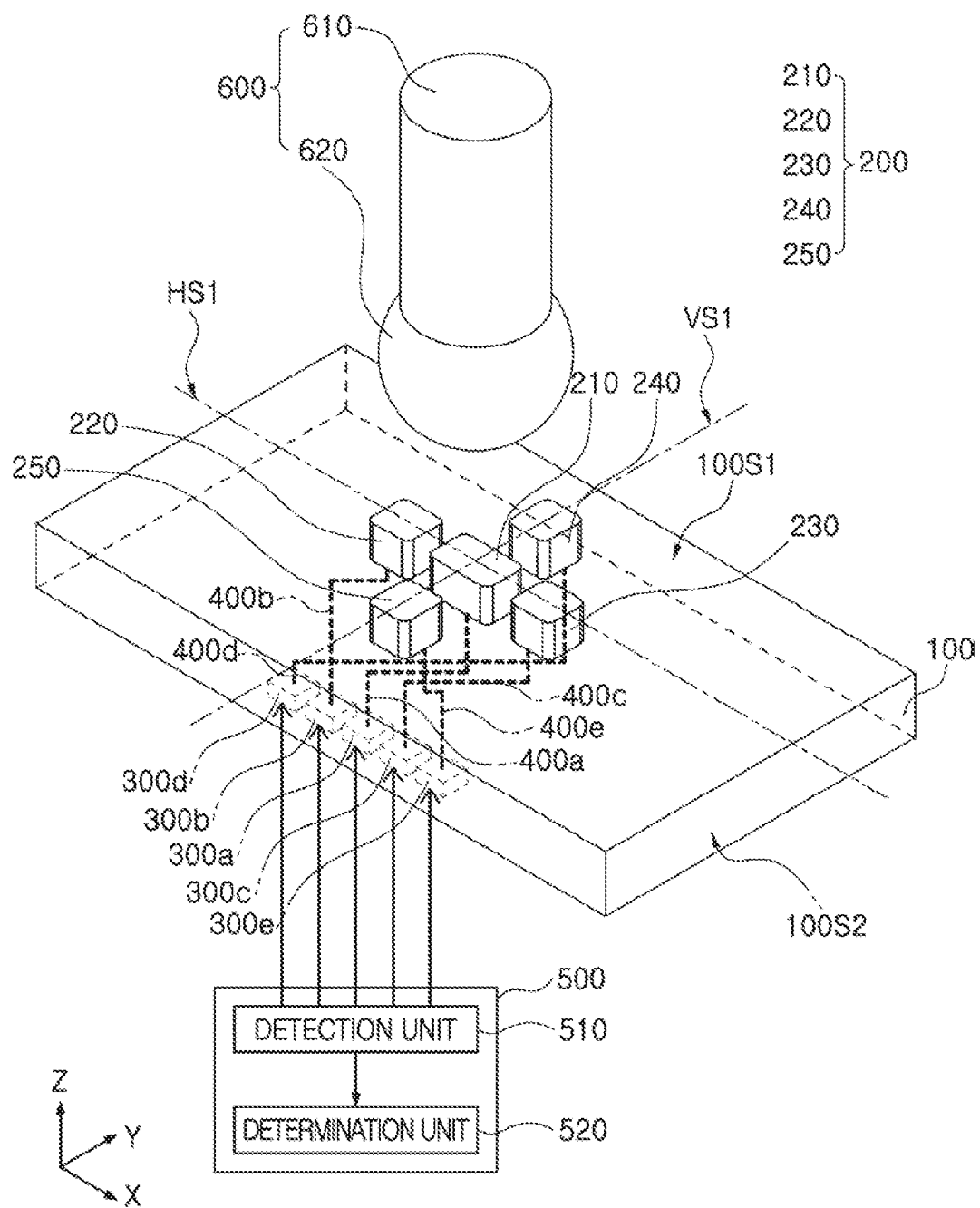
FIG. 10 is a view schematically illustrating another example of a configuration of a semiconductor substrate and a test device for testing the same according to an embodiment of the present disclosure.

FIG. 10 is a view schematically illustrating another example of a configuration of a semiconductor substrate 100 and a test device 500 for testing the same according to an embodiment of the present disclosure. The same components as those shown in FIG. 1 have the same reference numerals in FIG. 10. Therefore, contents overlapping with the contents described with reference to FIG. 1 will be omitted.

Referring to FIG. 10, a bump pad unit 200 may include a main bump pad 210, a first side bump pad 220, a second side bump pad 230, a third side bump pad 240, and a fourth side bump pad 250 that are disposed on an upper surface 100S1 of the semiconductor substrate 100. The first to fourth side bump pads 220, 230, 240, and 250 may have the same shape and size each other. The first side bump pad 220 and the second side bump pad 230 may be arranged in a horizontal line form along the x-direction around the main bump pad 210. The first side bump pad 220 and the second side bump pad 230 may be disposed on the upper surface 100S1 to be spaced apart from each other in the opposite directions, based on the main bump pad 210. In addition, the first side bump pad 220 and the second side bump pad 230 may be arranged to be symmetrical with respect to the main bump pad 210. Here, the main bump pad 210, the first side bump pad 220, and the second side bump pad 230 may be arranged to share the horizontal axis HS1 that is configured to be parallel to the x-axis. The third side bump pad 240 and the fourth side bump pad 250 may be arranged in a vertical line form along the y-axis around the main bump pad 210. The third side bump pad 240 and the fourth side bump pad 250 may be arranged on the upper surface 100S1 of the semiconductor substrate 100 spaced apart from each other in the opposite direction, based on the main bump pad 210. In addition, the third side bump pad 240 and the fourth side bump pad 250 may be arranged to be symmetrical with respect to the main bump pad 210. Here, the main bump pad 210, the third side bump pad 240, and the fourth side bump pad 250 may be arranged to share a vertical axis VS1 that is configured to be parallel to the y-axis.

Referring to FIG. 10, test pads 300a, 300b, 300c, 300d, and 300e may be electrically connected to the main bump pad 210, the first side bump pad 220, the second side bump pad 230, the third side bump pad 240, and the fourth side bump pad 250 by traces 400a, 400b, 400c, 400d, and 400e, respectively. The traces 400a, 400b, 400c, 400d, and 400e may be disposed in the semiconductor substrate 100 to electrically connect the main bump pad 210, the first side bump pad 220, the second side bump pad 230, the third side bump pad 240, and the fourth side bump pad 250 to the test pads 300a, 300b, 300c, 300d, and 300e, respectively. The first trace 400a may be disposed in the semiconductor 100 to electrically connect the main bump pad 210 to the first test pad 300a. The second trace 400b may be disposed in the semiconductor 100 to electrically connect the first side bump pad 220 to the second test pad 300b. The third trace 400e may be disposed in the semiconductor 100 to electrically connect the second side bump pad 230 to the third test pad 300c. The fourth trace 400d may be disposed in the semiconductor 100 to electrically connect the third side bump pad 240 to the fourth test pad 300d. The fifth trace 400e may be disposed in the semiconductor 100 to electrically connect the fourth side bump pad 250 to the fifth test pad 300e.

Referring to FIG. 10, the detection unit 510 may detect the energization state of the main bump pad 210 and the first side bump pad 220, the energization state of the main bump pad 210 and the second side bump pad 230, the energization state of the main bump pad 210 and the third side bump pad 240, and the energization state of the main bump pad 210 and the fourth side bump pad 250 through the test pads 300a, 300b, 300e, 300d, and 300e, respectively.

Referring to FIG. 10, the determination unit 520 may determine whether a failure has occurred, based on the detection result of the detection unit 510. As an example, the determination unit 520 may determine whether the bonding state of the bump pad unit 200 and a conductive structure bonded to the bump pad unit 200 is normal. As the detection result of the detection unit 510, when the energization state of the main bump pad 210 and the first side bump pad 220, the energization state of the main bump pad 210 and the second side bump pad 230, the energization state of the main bump pad 210 and the third side bump pad 240, and the energization state of the main bump pad 210 and the fourth side bump pad 250 are all short-circuited states, the determination unit 520 may determine that no failure has occurred. Conversely, as the detection result of the detection unit 510, when at least one of the energization state of the main bump pad 210 and the first side bump pad 220, the energization state of the main bump pad 210 and the second side bump pad 230, the energization state of the main bump pad 210 and the third side bump pad 240, and the energization state of the main bump pad 210 and the fourth side bump pad 250 is an open state, the determination unit 520 may determine that a failure has occurred. In addition, the determination unit 520 may determine in which direction the bonding position of a conductive structure bonded to the bump pad unit 200 is shifted with respect to the main bump pad 210, based on the detection result of the detection unit 510.

FIGS. 11 to 15 are views for explaining in more detail an example of a test method using the semiconductor substrate 100 and the test device 500 illustrated in FIG. 10. The same components as those illustrated in FIGS. 3 to 9 have the same reference numerals in FIGS. 11 to 15. Therefore, hereinafter, the contents overlapping with the contents described with reference to FIGS. 3 to 9 will be omitted.

Figure 11:
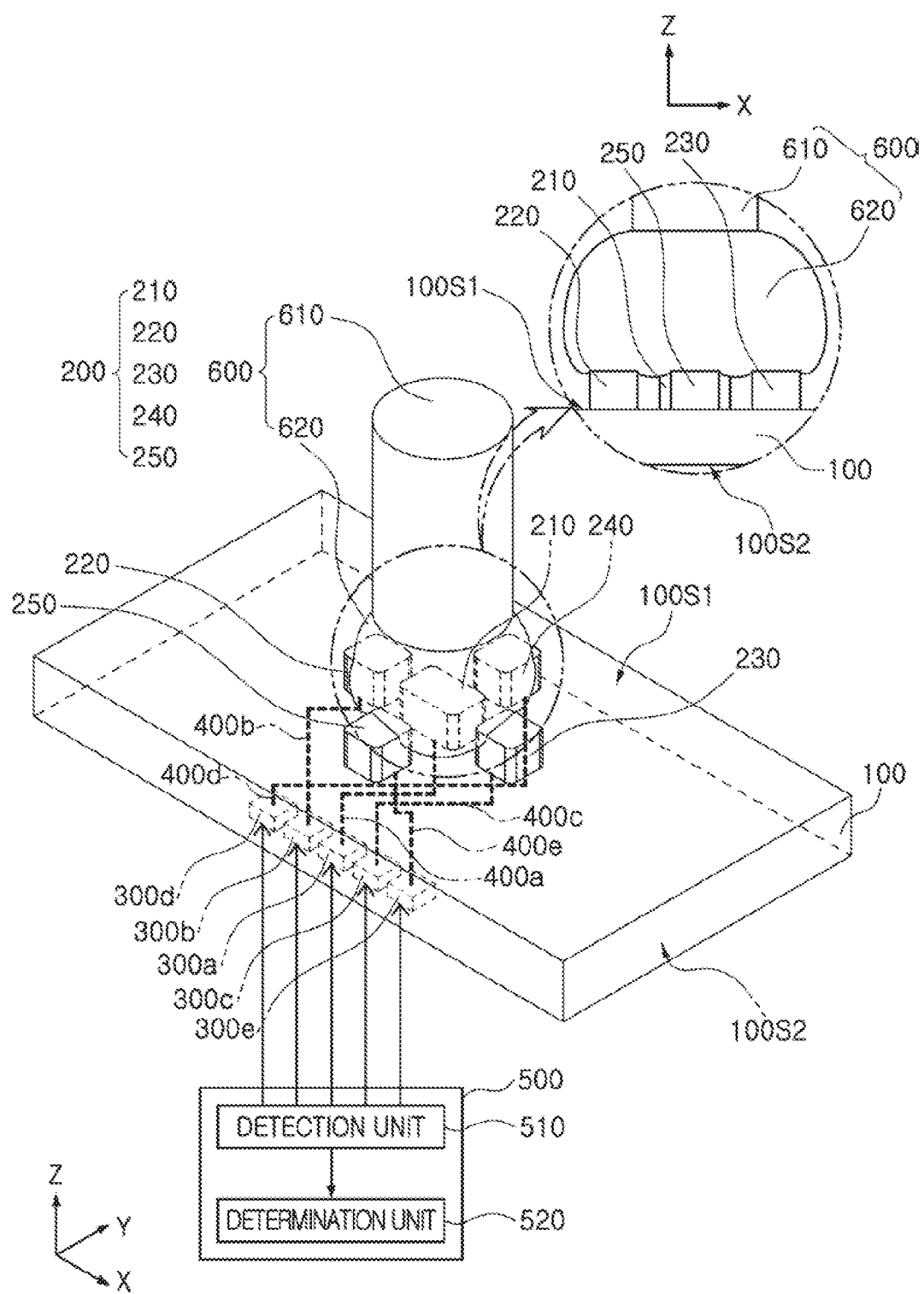
FIGS. 11 to 15 are views for explaining an example of a test method in more detail using the semiconductor substrate and the test device illustrated in FIG. 10.
Figure 12:
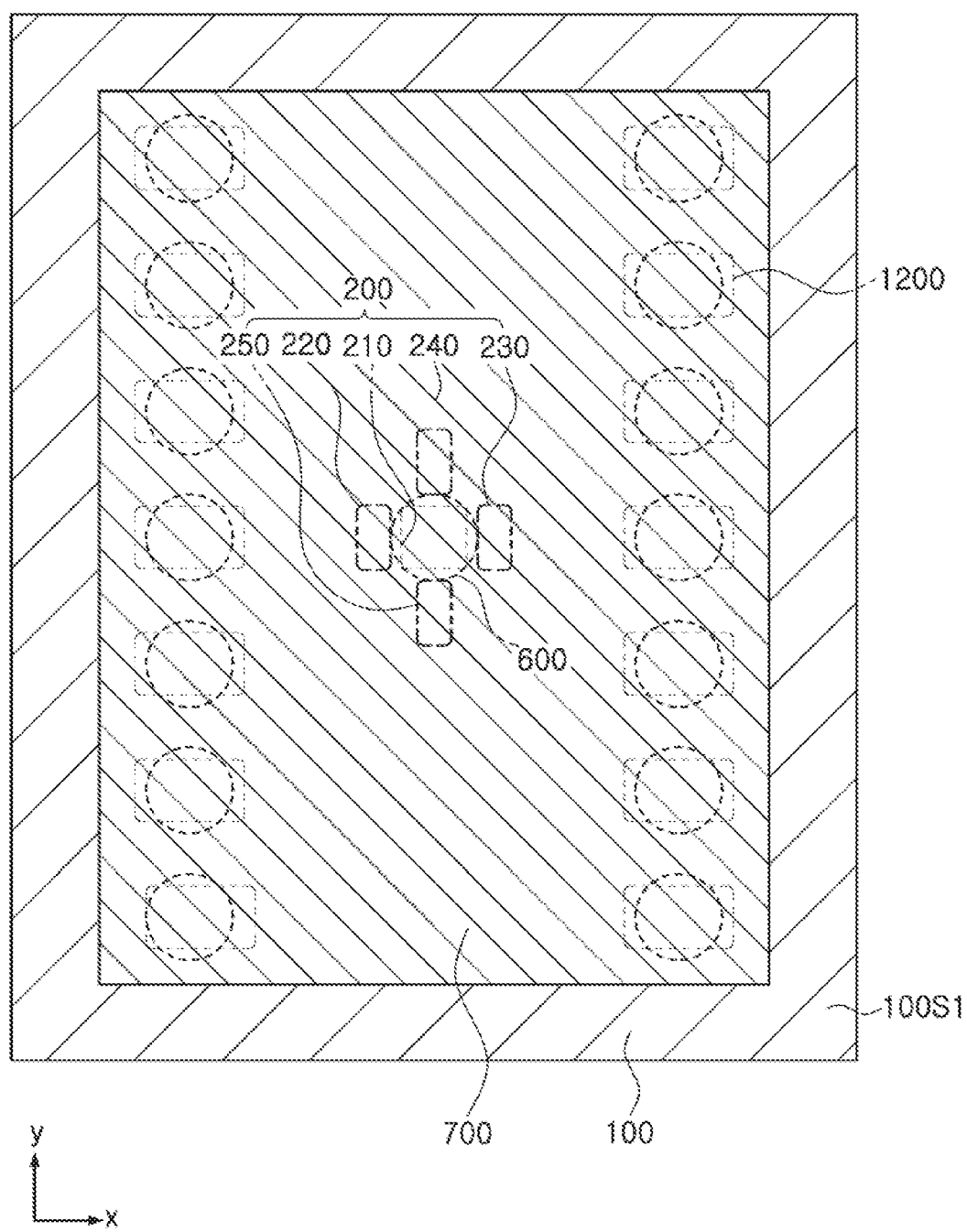
Figure 13:
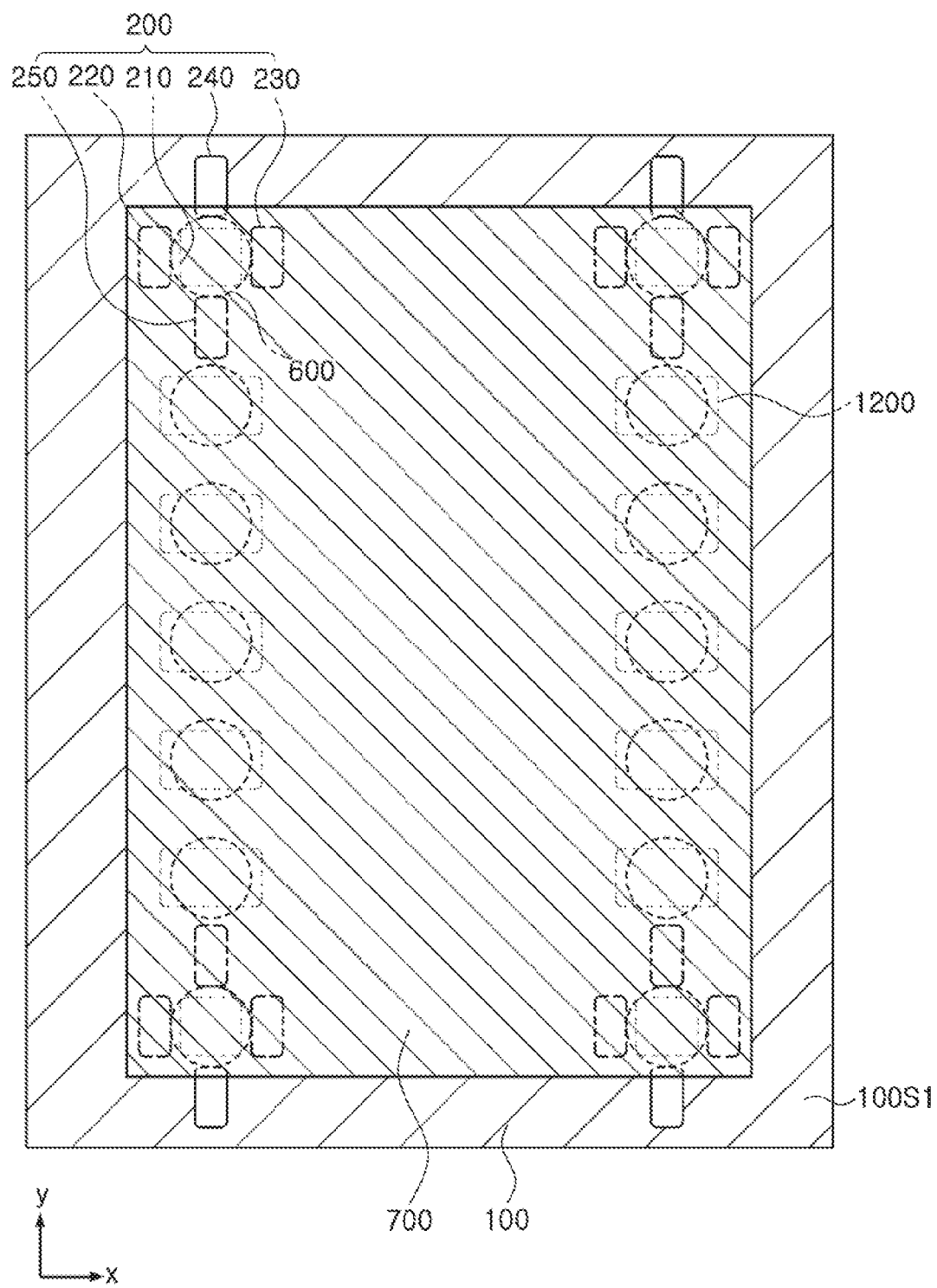

FIG. 11 illustrates a case for which the bonding state of the bump pad unit 200 and the bump 600 bonded to the bump pad unit 200 is normal. FIGS. 12 and 13 are plan views of the semiconductor substrate 100 of a case for which the arrangement state of the semiconductor chip 700 bonded to the semiconductor substrate 100 through the bump pad unit 200 and the bump 600 is normal.

Referring to FIGS. 11 and 12, in a state in which the bump pad unit 200 and the bump 600 are bonded to each other, the joint 620 may be bonded and electrically connected to all of the main bump pad 210, the first side bump pad 200, the second side bump pad 230, the third side bump pad 240, and the fourth side bump pad 250. In this case, the detection unit 510 may detect the energization state of the main bump pad 210 and the first side bump pad 220, the energization state of the main bump pad 210 and the second side bump pad 230, the energization state of the main bump pad 210 and the third side bump pad 240, and the energization state of the main bump pad 210 and the fourth side bump pad 250 through the test pads 300a, 300b, 300c, 300d, and 300e. The main bump pad 210 is electrically connected to all of the first to fourth side bump pads 220, 230, 240, and 250 by the joint 620, so that the detection results of the detection unit 510 may all be short-circuited states. Because the detection results of the detection unit 510 are all short-circuited states, the determination unit 520 may determine that no failure has occurred. Further, in this case, because the bonding failure of the bump pad unit 200 and the bump 600 has not occurred, the determination unit 520 may determine that the bonding state of the bump pad unit 200 and the bump 600 is normal. At this time, if the semiconductor chip 700 is bonded onto the semiconductor substrate 100 through the bump pad unit 200 and the bump 600, the determination unit 520 may determine that the alignment state of the semiconductor substrate 100 and the semiconductor chip 700 is normal.

Referring to FIG. 12, the bump pad unit 200 including the main bump pad 210, the first to fourth side bump pads 220, 230, 240, and 250 may be disposed at the center of the upper surface 100S1 of the semiconductor substrate 100. Although not illustrated, a plurality of bump pad unit 200 may be disposed on the upper surface 100S1 of the semiconductor substrate 100. In this case, bonding pads 1200 composed of a single pad may be arranged in two rows on the upper surface 100S1 of the semiconductor substrate 100, but are not limited thereto. In other words, although not illustrated, the bonding pads 1200 may be disposed in a plurality of columns on the upper surface 100S1 of the semiconductor substrate 100. In addition, the bumps 600 may be disposed and bonded on the bump pad unit 200 and the bonding pads 1200 for connecting the semiconductor chip 700 to the semiconductor substrate 100. As illustrated in FIG. 12, when the semiconductor substrate 100 is configured to include one bump pad unit 200, the space occupied by the test pads and bumps connected to the bump pad unit 200 in the semiconductor substrate 100 can be reduced.

Referring to FIG. 13, the bump pad unit 200 including the main bump pad 210 and the first to fourth side bump pads 220, 230, 240 and 250 may be disposed in at least two of four corner regions of the upper surface 100S1 of the semiconductor substrate 100. In addition, the bonding pads 1200, which are single pads, may be arranged in two rows, but are not limited thereto. In other words, although not illustrated, the bonding pads 1200 may be disposed in a plurality of columns on the upper surface 100S1 of the semiconductor substrate 100. In addition, the bumps 600 may be disposed and bonded on the plurality of bump pad unit 200 and the bonding pads 1200.

Referring to FIGS. 12 and 13, when the alignment state of the semiconductor substrate 100 and the semiconductor chip 700 is normal, the bump 600 may be electrically connected to all of the main bump pad 210, the first side bump pad 220, the second side bump pad 230, the third side bump pad 240, and the fourth side bump pad 250. In this case, the bump 600 and the bump pad unit 200 may be bonded such that the center of the bump 600 and the center of the bump pad unit 200 coincide with each other. Although not illustrated, the semiconductor substrate 100 may be configured by disposing the bump pad unit 200 and the bonding pads 1200 in various forms, unlike those illustrated in FIGS. 12 and 13.

Referring to the above descriptions, as an example, the bump pad unit 200 is disposed at the center of the upper surface 100S1, whereby a phenomenon that the center is lifted when the semiconductor substrate 100 and the semiconductor chip 700 are bonded can be detected. In addition, as another example, a plurality of bump pad unit 200 are disposed on the upper surface 100S1, whereby a tilting phenomenon occurring when the substrate 100 and the semiconductor chip 700 are bonded can be effectively detected. Further, as another example, the bump pad unit 200 are disposed in the corner regions of the semiconductor substrate 100, whereby a phenomenon in which the edge portion is lifted when the substrate 100 and the semiconductor chip 700 are bonded can be detected. As such, according to the embodiments of the present disclosure, a wetting failure due to the warpage of the semiconductor substrate 100 or the semiconductor chip 700 can also be detected.

Figure 14:
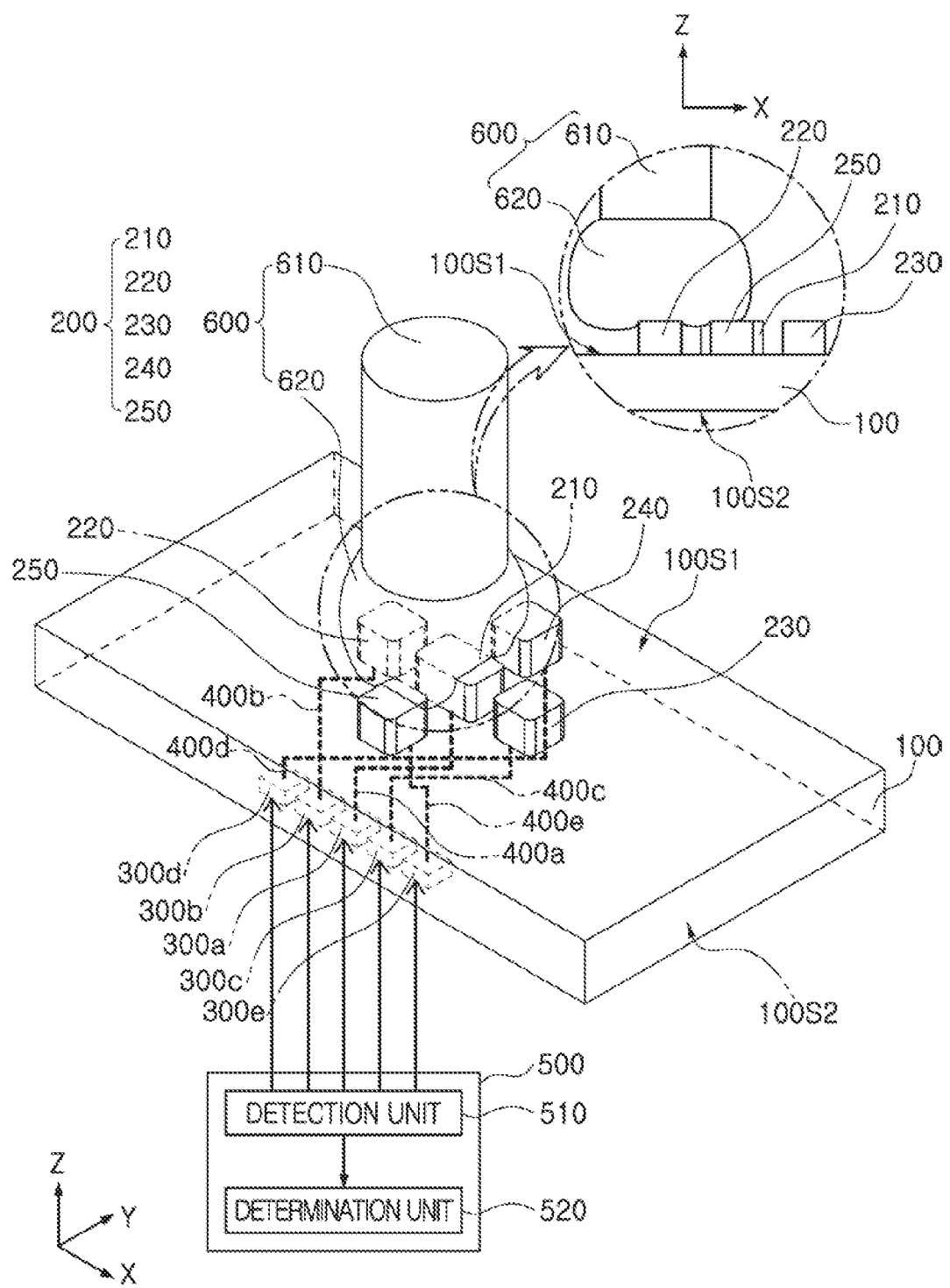
Figure 15:
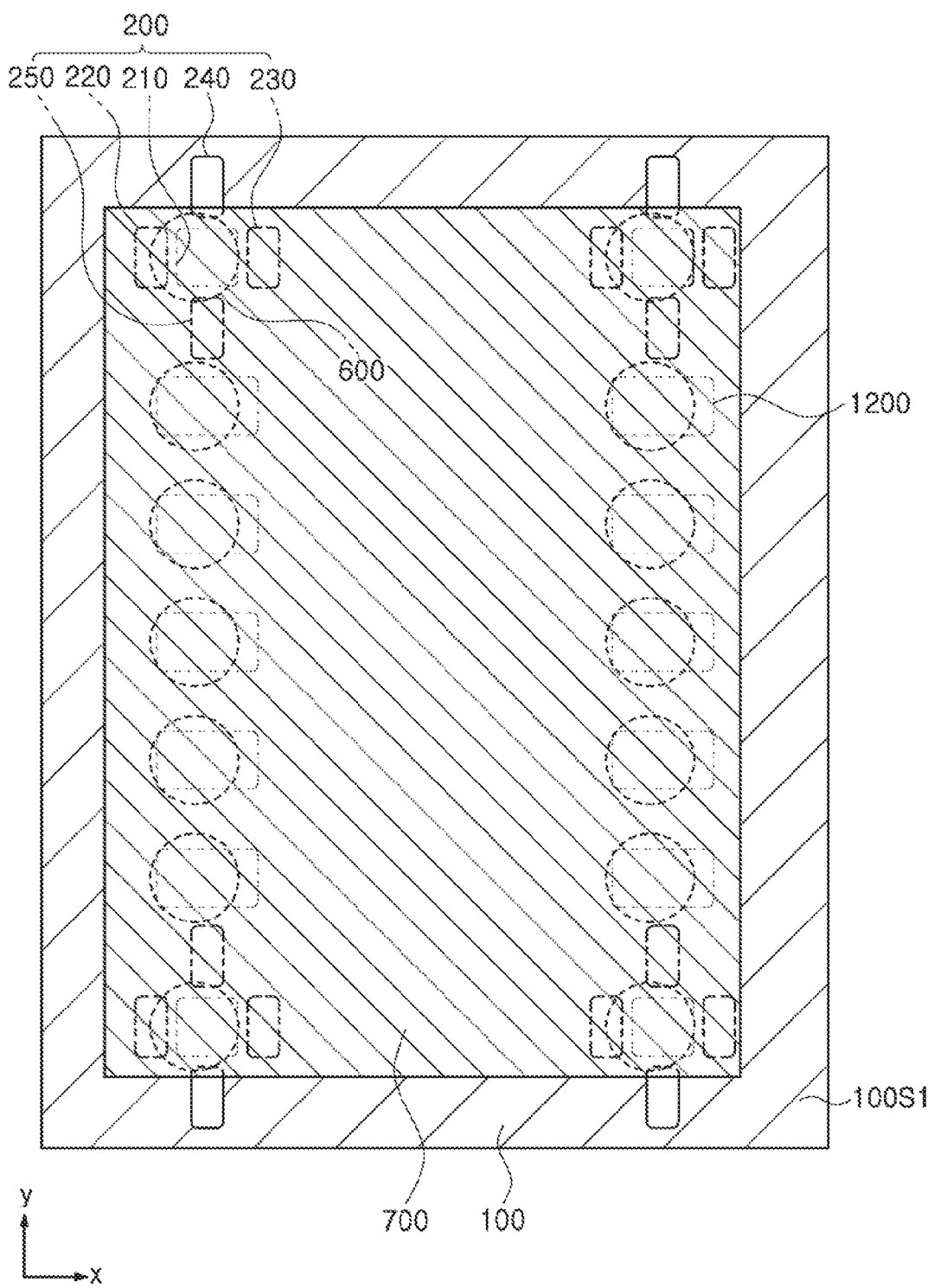

FIG. 14 illustrates a case for which the bonding state of the bump pad unit 200 and the bump 600 bonded on the bump pad unit 200 is abnormal. FIG. 15 is a plan view of the semiconductor substrate 100 of a case for which the alignment state of semiconductor chip 700 bonded on the semiconductor substrate 100 through the bump pad unit 200 and the bump 600 is abnormal.

Referring to FIGS. 14 and 15, when the bump pad unit 200 and the bump 600 are bonded to each other, the joint 620 may be bonded only to the main bump pad 210, the first side bump pad 220, the third side bump pad 240, and the fourth side bump pad 250, and might not be bonded to the second side bump pad 230. Because only the main bump pad 210, the first side bump pad 220, the third side bump pad 240, and the fourth side bump pad 250 are electrically connected by the joint 620, as the detection result of the detection unit 510, only the energization state of the main bump pad 210 and the second side bump pad 230 is an open state, and the rest of the energization states are short-circuited states. At least one of the detection results of the detection unit 510 is open state, whereby the determination unit 520 may determine that a failure has occurred. Further, in this case, because the bonding failure of the bump pad unit 200 and the bump 600 has occurred, the determination unit 520 may determine that the bonding state of the bump pad unit 200 and the bump 600 is abnormal. Also, based on the detection result, the determination unit 520 may determine that the bonding position of the semiconductor chip 700 has been shifted in the opposite direction of the second side bump pad 230 with respect to the main bump pad 210. At this time, if the semiconductor chip 700 is bonded to the semiconductor substrate 100 through the bump pad unit 200 and the bump 600, the determination unit 520 may determine that the alignment state of the semiconductor substrate 100 and the semiconductor chip 700 is abnormal.

Referring to FIG. 15, as an example of the cases that the alignment state of the semiconductor substrate 100 and the semiconductor chip 700 is abnormal, the bump 600 may be electrically connected to the rest of the pads except the second side bump pad 230. Accordingly, the semiconductor chip 700 may be bonded on the semiconductor substrate 100 in a form of moving to the left along the x-axis. As described above, when the alignment state of the semiconductor substrate 100 and the semiconductor chip 700 is abnormal, the bump 600 and the bump pad unit 200 may be bonded to each other such that the center of the bump 600 and the center of the bump pad unit 200 are misaligned.

Although not illustrated, in a state in which the bump pad unit 200 and the bump 600 are bonded to each other, the joint 620 may be bonded only to the main bump pad 210, the first side bump pad 220, the second side bump pad 230, and the third side bump pad 240, and might not be bonded to the fourth side bump pad 250. Because only the main bump pad 210, the first side bump pad 220, the second side bump pad 230, and the third side bump pad 240 are electrically connected by the joint 620, as the detection result of the detection unit 510, only the energization state of the main bump pad 210 and the fourth side bump pad 250 is an open state, and the rest of the energization states are short-circuited states. Because at least one of the detection results of the detection unit 510 is an open state, the determination unit 520 may determine that a failure has occurred. Further, in this case, because the bonding failure of the bump pad unit 200 and the bump 600 has occurred, the determination unit 520 may determine that the bonding state of the bump pad unit 200 and the bump 600 is abnormal. In addition, based on the detection result, the determination unit 520 may determine that the bonding position of the bump pad unit 200 and the bump 600 has shifted in the opposite direction of the fourth side bump pad 250 with respect to the main bump pad 210. Here, if the semiconductor chip 700 is bonded to the semiconductor substrate 100 through the bump pad unit 200 and the bump 600, the determination unit 520 may determine that the alignment state of the semiconductor substrate 100 and the semiconductor chip 700 is abnormal. At this time, the semiconductor chip 700 may be bonded onto the semiconductor substrate 100 in a form in which the semiconductor chip 700 has moved upward along the y-axis.

Although not illustrated, in a state in which the bump pad unit 200 and the bump 600 are bonded to each other, the joint 620 may be bonded only to the main bump pad 210, the second side bump pad 230, the third side bump pad 240, and the fourth side bump pad 250, and might not be bonded to the first side bump pad 220. As the detection result of the detection unit 510, because the main bump pad 210, the second side bump pad 230, the third side bump pad 240, and the fourth side bump pad 250 are electrically connected to each other by the joint 620, only the energization state of the main bump pad 210 and the first side bump pad 220 is an open state, and the rest of the energization states are open states. Because at least one of the detection results of the detection unit 510 is an open state, the determination unit 520 may determine that a failure has occurred. Further, in this case, the bonding failure of the bump pad unit 200 and the bump 600 has occurred, whereby the determination unit 520 may determine that the bonding state of the bump pad unit 200 and the bump 600 is abnormal. Also, based on the detection results, the determination unit 520 may determine that the bonding position of the bump pad unit 200 and the bump 600 has shifted in the opposite direction of the first side bump pad 220 with respect to the main bump pad 210. Here, if the semiconductor chip 700 is bonded to the semiconductor substrate 100 through the bump pad unit 200 and the bump 600, the determination unit 520 may determine that the alignment state of the semiconductor substrate 100 and the semiconductor chip 700 is abnormal. At this time, the semiconductor chip 700 may be bonded onto the semiconductor substrate 100 in a form in which the semiconductor chip 700 has moved to the right along the x-axis.

Although not illustrated, in a state in which the bump pad unit 200 and the bump 600 are bonded to each other, the joint 620 may be bonded only to the main bump pad 210, the first side bump pad 220, the second side bump pad 230, and the fourth side bump pad 250, and might not be bonded to the third side bump pad 240. As the detection result of the detection unit 510, because the main bump pad 210, the first side bump pad 220, the second side bump pad 230, and the fourth side bump pad 250 are electrically connected to each other by the joint 620, only the energization state of the main bump pad 210 and the third side bump pad 240 is an open state, and the rest of the energization states are open states. Because at least one of the detection results of the detection unit 510 is an open state, the determination unit 520 may determine that a failure has occurred. Further, in this case, because the bonding failure of the bump pad unit 200 and the bump 600 has occurred, the determination unit 520 may determine that the bonding state of the bump pad unit 200 and the bump 600 is abnormal. Also, based on the detection results, the determination unit 520 may determine that the bonding position of the bump pad unit 200 and the bump 600 has shifted in the opposite direction of the first side bump pad 220 with respect to the main bump pad 210. Here, if the semiconductor chip 700 is bonded onto the semiconductor substrate 100 through the bump pad unit 200 and the bump 600, the determination unit 520 may determine that the alignment state of the semiconductor substrate 100 and the semiconductor chip 700 is abnormal. At this time, the semiconductor chip 700 may be bonded onto the semiconductor substrate 100 in a form in which the semiconductor chip 700 has moved to the right along the y-axis.

As described above, the embodiments of the present disclosure have been described with reference to the drawings included in this specification. However, this is for explaining what is to be presented in the present disclosure, and is not intended to limit what is to be presented in the present disclosure in a shape that is presented in detail. Various other modifications will be possible as long as the technical idea suggested in the present disclosure is reflected.

What is claimed is:

1. A semiconductor package comprising:
   a semiconductor substrate including an upper surface and a lower surface;
   a bump pad unit including a main bump pad disposed on the upper surface, and a plurality of side bump pads disposed on the upper surface to be spaced apart from the main bump pad;
   a bonding pad disposed on the upper surface;
   bumps comprising a first bump bonded to the bump pad unit and a second bump bonded to the bonding pad;
   test pads disposed on the upper surface or the lower surface; and
   traces provided in the semiconductor substrate to connect the main bump pad and the plurality of side bump pads to the test pads in a one-to-one manner,
   wherein the test pads are electrically connected to the main bump pad and the plurality of side bump pads, respectively, such that whether the main bump pad and the plurality of side bump pads are electrically connected is detected by a test signal input from outside of the semiconductor substrate,
   wherein energization states between the main bump pad and the plurality of side bump pads are detected to determine a bonding state between the bump pad unit and the first bump.

2. The semiconductor package of claim 1, further comprising:
   a semiconductor chip disposed on the bumps to be mounted on the semiconductor substrate.

3. The semiconductor package of claim 2,
   wherein the bump pad unit is disposed at a center of the semiconductor substrate, and
   wherein the bumps are disposed on the bump pad unit and the bonding pad to connect the semiconductor chip to the semiconductor substrate.

4. The semiconductor package of claim 2,
   wherein at least one additional bump pad unit is disposed on the upper surface of the semiconductor substrate, and
   wherein additional bumps are disposed on the at least one additional bump pad unit.

5. The semiconductor package of claim 2,
   wherein the semiconductor package comprises a plurality of bump pad units,
   wherein the plurality of bump pad units are disposed in at least two regions of four corner regions of the semiconductor substrate.

6. The semiconductor package of claim 1, wherein the plurality of side bump pads comprise:

a first side bump pad disposed on the upper surface of the semiconductor substrate spaced apart from the main bump pad in a first side direction from the main bump pad; and a second side bump pad disposed on the upper surface of the semiconductor substrate spaced apart from the main bump pad in a second side direction from the main bump pad.

7. The semiconductor package of claim 6, wherein the first side bump pad and the second side bump pad have the same shape and size, and are disposed to be symmetrical with respect to the main bump pad by being spaced apart from the main bump pad by the same distance in the first and second directions, wherein the first and second directions are opposite directions.

8. The semiconductor package of claim 7, wherein:
the test pads comprise first, second, and third test pads;
the traces comprise first, second, and third traces;
the first trace is disposed to electrically connect the main bump pad to the first test pad;
the second trace is disposed to electrically connect the first side bump pad to the second test pad; and
the third trace is disposed to electrically connect the second side bump pad to the third test pad.

9. The semiconductor package of claim 1,
wherein the plurality of side bump pads include first, second, third, and fourth side bump pads, wherein the first side bump pad and the second side bump pad have the same shape and size, are arranged transversely around the main bump pad, and are disposed on the upper surface of the semiconductor substrate to be symmetrical with respect to the main bump pad, and wherein the third side bump pad and the fourth side bump pad have the same shape and size, are arranged longitudinally around the main bump pad, and are disposed on the upper surface of the semiconductor substrate to be symmetrical with respect to the main bump pad.

10. The semiconductor package of claim 9, wherein:
the test pads comprise first, second, third, fourth, and fifth test pads;
the traces comprise first, second, third, fourth, and fifth traces;
the first trace is disposed to electrically connect the main bump pad to the first test pad;
the second trace is disposed to electrically connect the first side bump pad to the second test pad;
the third trace is disposed to electrically connect the second side bump pad to the third test pad;
the fourth trace is disposed to electrically connect the third side bump pad to the fourth test pad; and
the fifth trace is disposed to electrically connect the fourth side bump pad to the fifth test pad.

\* \* \* \* \*